United States Patent
Friend et al.

(10) Patent No.: US 9,341,683 B2
(45) Date of Patent: May 17, 2016

(54) NAVIGATION SYSTEM AND METHOD FOR MACHINE

(71) Applicant: Caterpillar Inc., Peoria, IL (US)

(72) Inventors: Paul R. Friend, Morton, IL (US); Frank A. Willis, Canton, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 14/499,613

(22) Filed: Sep. 29, 2014

(65) Prior Publication Data
US 2016/0091317 A1   Mar. 31, 2016

(51) Int. Cl.
| | |
|---|---|
| *G01C 17/38* | (2006.01) |
| *G01R 33/025* | (2006.01) |
| *G01C 21/16* | (2006.01) |
| *G01R 33/02* | (2006.01) |
| *G01C 21/00* | (2006.01) |

(52) U.S. Cl.
CPC .............. *G01R 33/025* (2013.01); *G01C 17/38* (2013.01); *G01C 21/005* (2013.01); *G01C 21/165* (2013.01); *G01R 33/02* (2013.01)

(58) Field of Classification Search
CPC .... G01C 17/38; G01C 21/005; G01C 21/165; G01R 33/025
USPC ........... 701/500, 508, 525; 700/500, 508, 525
See application file for complete search history.

(56) References Cited

U.S. PATENT DOCUMENTS

| | | | | |
|---|---|---|---|---|
| 4,416,067 A | * | 11/1983 | Scherer ................ | G01R 33/025 324/202 |
| 4,686,772 A | * | 8/1987 | Sobel ..................... | G01C 17/38 33/333 |
| 4,890,233 A | * | 12/1989 | Ando ..................... | G01C 21/08 318/587 |
| 5,235,514 A | * | 8/1993 | Matsuzaki ............. | G01C 21/28 340/995.28 |
| 6,286,222 B1 | * | 9/2001 | Voto ....................... | G01C 17/38 33/356 |

(Continued)

FOREIGN PATENT DOCUMENTS

| | | | |
|---|---|---|---|
| EP | 237806 A1 | * | 9/1987 |
| EP | 237806 B1 | * | 12/1989 |

(Continued)

OTHER PUBLICATIONS

EPO machine translation of EP 237806 A1 (original EP document published Sep. 23, 1987).*

*Primary Examiner* — Behrang Badii
*Assistant Examiner* — David Testardi (57) ABSTRACT

A method of determining a heading of a machine having an implement is provided. The method includes determining a first heading data of the machine using an inertial sensor. The method includes determining a second heading data of the machine using a magnetometer. The method includes determining a position of the implement in a stationary state. The method also includes calculating a corrected second heading data based on a predefined relation between the position of the implement in the stationary state and the second heading data. The method further includes determining the heading of the machine based on the first heading data and the corrected second heading data.

20 Claims, 4 Drawing Sheets

(56) References Cited

U.S. PATENT DOCUMENTS

| | | | | |
|---|---|---|---|---|
| 6,401,644 B2* | 6/2002 | Fadeley | ................ | B63H 11/11 |
| | | | | 114/151 |
| 6,516,272 B2 | 2/2003 | Lin | | |
| 6,842,991 B2* | 1/2005 | Levi | ................ | G01C 19/42 |
| | | | | 33/316 |
| 7,162,367 B2* | 1/2007 | Lin | ................ | G01C 21/28 |
| | | | | 342/357.57 |
| 7,346,995 B2* | 3/2008 | Olson | ................ | G01C 17/38 |
| | | | | 33/356 |
| 7,743,721 B2* | 6/2010 | Barrett | ................ | B65H 25/46 |
| | | | | 114/144 A |
| 8,326,561 B2* | 12/2012 | Navarro, Jr. | ........... | G01C 19/42 |
| | | | | 702/93 |
| 8,463,569 B2 | 6/2013 | Cain et al. | | |
| 2012/0299702 A1* | 11/2012 | Edara | ................ | G01S 19/49 |
| | | | | 340/8.1 |
| 2013/0046463 A1 | 2/2013 | Bengtson et al. | | |

FOREIGN PATENT DOCUMENTS

| | | | |
|---|---|---|---|
| EP | 2677275 | | 12/2013 |
| JP | 57028208 | A * | 2/1982 |
| JP | 03004115 | A * | 1/1991 |

\* cited by examiner

NAVIGATION SYSTEM AND METHOD FOR MACHINE

TECHNICAL FIELD

The present disclosure relates to a navigation system and method, and more specifically to a navigation system and method for a machine having an implement.

BACKGROUND

Currently, navigation systems on machines use inertial measurement units along with magnetometers for providing positioning/navigation data to the navigation systems. The magnetometers provide orientation data related to the machine to the navigation systems. The magnetometers are influenced by static and/or dynamic interferences such as iron distortions present around the magnetometer such as metal platforms, electrical circuits, other ferrous objects present on as well as around the machine, and so on. This may lead to errors in outputs of the magnetometers.

Errors due to static and/or dynamic interferences on the magnetometer are usually compensated by known calibration methods. But, for machines having a moving implement, a make-up of iron around the magnetometer may change dynamically based on the position of the implement with respect to the machine. The known calibration methods for static and/or dynamic interferences may be unable to provide compensation for such dynamic interferences due to the moving implement and calibrate the magnetometers accordingly. As a result, the magnetometer may be unable to provide accurate orientation data leading to errors in the positioning of the machine determined by the navigation system.

European Patent Application Number 2,677,275 discloses a method for compensating for soft iron magnetic disturbances in a heading reference system. The system includes a heading gyro disposed along a heading measurement axis. The system includes a magnetometer coupled to the heading gyro for providing an accurate heading relative to magnetic north. The method includes detecting changes in the magnetometer due to soft iron magnetic disturbances during a detection period for providing a first detected magnitude of change. The method includes detecting changes in the gyro heading relative to magnetic north during the detection period for providing a second detected magnitude of change. The method includes comparing the first and second detected magnitude of changes for providing a potential difference value of change. The method includes providing a predetermined acceptable threshold value of change. The method also includes determining if the potential difference value of change exceeds the predetermined acceptable threshold value of change. The method further includes providing a heading correction value to the heading reference system when the potential difference value of change exceeds the acceptable threshold value of change for enabling adjustment of the gyro heading to maintain the accurate heading in the face of the soft iron magnetic disturbances.

However, the '275 Patent Application does not disclose a method for compensating the soft iron magnetic disturbances caused due to a moving implement in a machine. Hence, there is a need for an improved navigation system for machines having the movable implement installed thereon.

SUMMARY OF THE DISCLOSURE

In one aspect of the present disclosure, a method of determining a heading of a machine having an implement is provided. The method includes determining a first heading data of the machine using an inertial sensor. The method includes determining a second heading data of the machine using a magnetometer. The method includes determining a position of the implement in a stationary state. The method also includes calculating a corrected second heading data based on a predefined relation between the position of the implement in the stationary state and the second heading data. The method further includes determining the heading of the machine based on the first heading data and the corrected second heading data.

In another aspect of the present disclosure, a navigation system of a machine is provided. The navigation system includes an inertial sensor configured to provide a first heading data of the machine. The navigation system also includes a magnetometer configured to provide a second heading data of the machine. The navigation system further includes an implement module configured to determine a position of the implement in a stationary state. The navigation system is configured to calculate a corrected second heading data based on a predefined relation between the position of the implement in the stationary state and the second heading data. The navigation system is also configured to determine the heading of the machine based on the first heading data and the corrected second heading data.

In another aspect of the present disclosure, a machine is provided. The machine includes a frame. The machine also includes an implement movable with respect to the frame. The machine further includes a navigation system associated with the machine. The navigation system includes an inertial sensor configured to detect a first heading data of the machine. The navigation system also includes a magnetometer configured to detect a second heading data of the machine. The navigation system further includes an implement module operatively coupled to the implement and configured to determine a position of the implement in a stationary state. The navigation system is configured to calculate a corrected second heading data based on a predefined relation between the position of the implement in the stationary state and the second heading data. The navigation system is also configured to determine the heading of the machine based on the first heading data and the corrected second heading data.

Other features and aspects of this disclosure will be apparent from the following description and the accompanying drawings.

BRIEF DESCRIPTION OF THE DRAWINGS

FIG. 3 includes FIGS. 3A, 3B, and 3C which are schematic representations of an output of a magnetometer, according to an aspect of the present disclosure.

DETAILED DESCRIPTION

Figure 1:
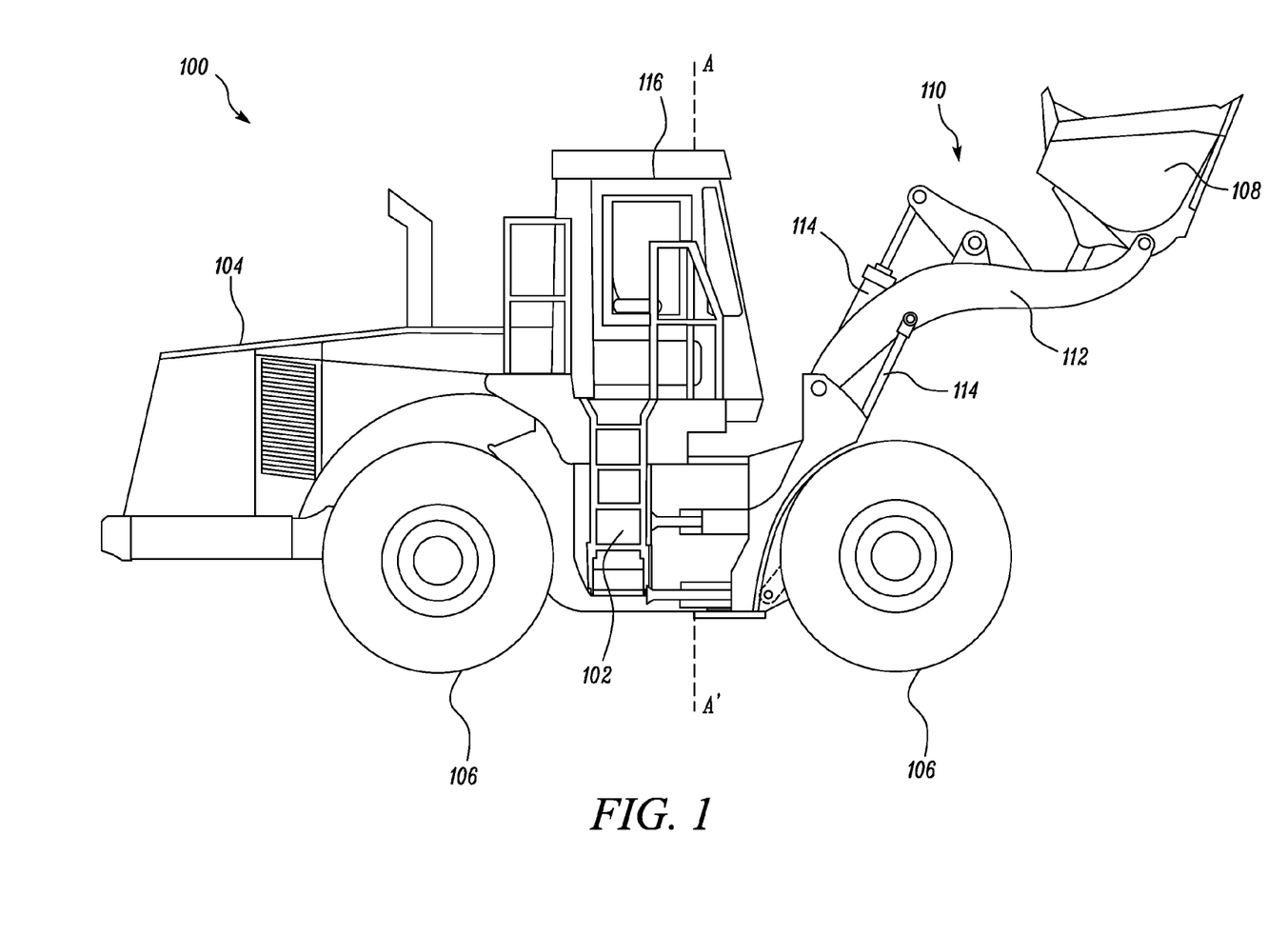
FIG. 1 is an exemplary machine, according to an aspect of the present disclosure.

Wherever possible, the same reference numbers will be used throughout the drawings to refer to the same or the like parts. Referring to FIG. 1, an exemplary machine 100 is illustrated. More specifically, the machine 100 is a wheel loader. In other aspects, the machine 100 may embody any other machine known in the art associated with industries including, but not limited to, construction, transportation, mining, forestry, agriculture, waste management and material handling. The machine 100 may include an excavator, a tracked loader, a backhoe loader, a dozer, a rope shovel, a mining shovel, an off-highway truck and so on.

The machine 100 includes a frame 102 or a chassis 102. The frame 102 is configured to support and/or mount one or more components of the machine 100. The machine 100 includes an enclosure 104 provided on the frame 102. The enclosure 104 is configured to house a power source (not shown). The power source may be any power source known in the art including, but not limited to, an internal combustion engine, an electric motor and so on, or a combination thereof. The power source is configured to provide power to the machine 100 for operational and mobility requirements. The machine 100 includes one or more ground engaging members 106 such as wheels or tracks. The ground engaging members 106 are configured to provide mobility to the machine 100 on ground.

The machine 100 includes an implement 108 coupled to the frame 102 through a linkage assembly 110. The implement 108 may be any implement known in the art, such as a bucket, a blade and so on. The implement 108 may be configured to transfer material, such as soil or debris, from one location to other. The linkage assembly 110 includes an arm 112. One end of the arm 112 is pivotally coupled to the frame 102. Other end of the arm 112 includes the implement 108 pivotally coupled thereon. The linkage assembly 110 includes one or more hydraulic and/or pneumatic cylinders 114 coupled to the frame 102, the arm 112 and/or the implement 108. The cylinders 114 are configured to raise or lower the arm 112 and/or the implement 108 with respect to the frame 102 of the machine 100.

The machine 100 includes an operator cabin 116 provided on the frame 102. The operator cabin 116 may include one or more control devices (not shown) such as a joystick, a steering wheel, pedals, levers, buttons, switches, and so on. The control device is configured to enable the operator to control the machine 100 on the ground and/or the implement 108 as per operational requirements. The operator cabin 116 may also include an operator interface 212 (explained with reference to FIG. 2) such as a display device, a sound source, a light source, or a combination thereof. The operator interface 212 may be configured to provide information to the operator related to various machine parameters.

Figure 2:
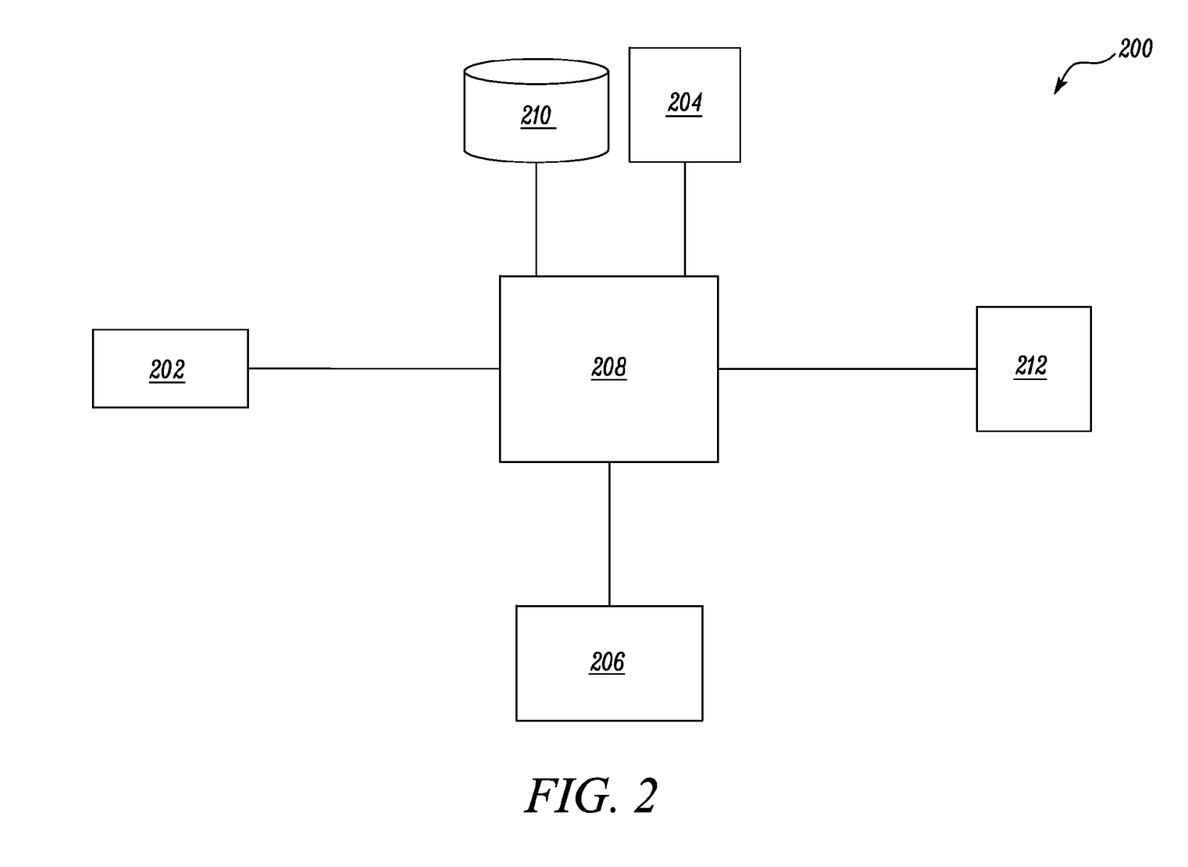
FIG. 2 is a schematic representation of a navigation system for the machine, according to an aspect of the present disclosure.

The present disclosure relates to a navigation system 200 provided on the machine 100. The navigation system 200 is configured to determine a heading and/or an attitude of the machine 100 on ground. Referring to FIG. 2, a schematic representation of the navigation system 200 is illustrated. The navigation system 200 includes an implement module 202 operatively coupled to the implement 108 and/or the linkage assembly 110. The implement module 202 may be any sensor known in the art, such as an accelerometer, an angular rate sensor, a yaw rate sensor, an implement position sensor, a pressure sensor associated with the cylinders 114 and so on. The implement module 202 is configured to generate a signal indicative of a position of the implement 108 in a stationary state with respect to the frame 102 of the machine 100. The implement module 202 is also configured to generate a signal indicative of a moving state of the implement 108 with respect to the frame 102 of the machine 100.

The navigation system 200 includes an inertial sensor 204 provided on the machine 100. The inertial sensor 204 may be any sensor known in the art such as an accelerometer, a gyroscopic sensor, an angular rate sensor, a yaw rate sensor and so on. The inertial sensor 204 is configured to generate a signal indicative of a first heading data of the machine 100. The first heading data may include location co-ordinates of the machine 100, a velocity of the machine 100, the attitude/orientation of the machine 100, a path of travel of the machine 100 and so on.

The navigation system 200 includes a magnetometer 206 provided on the machine 100. The magnetometer 206 is configured to generate a signal indicative of a second heading data of the machine 100. The second heading data may relate to an orientation and/or the attitude of the machine 100 on ground based on earth's magnetic field. Accordingly, the second heading data may include directional orientation of the machine 100. However, the second heading data may also include additional information, such as location co-ordinates of the machine 100.

Figure 3A:
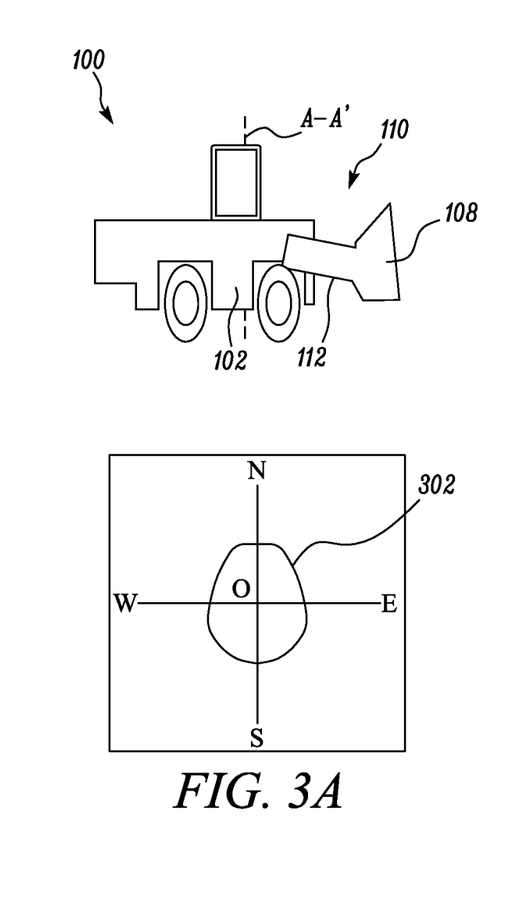
Figure 3B:
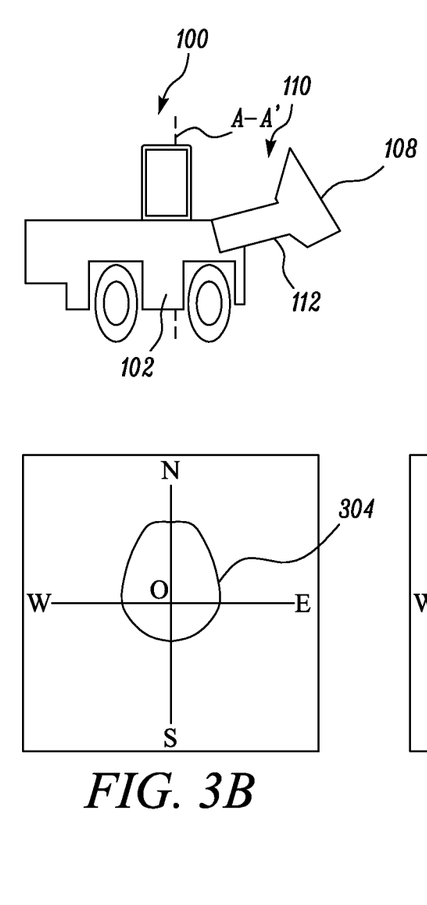
Figure 3C:
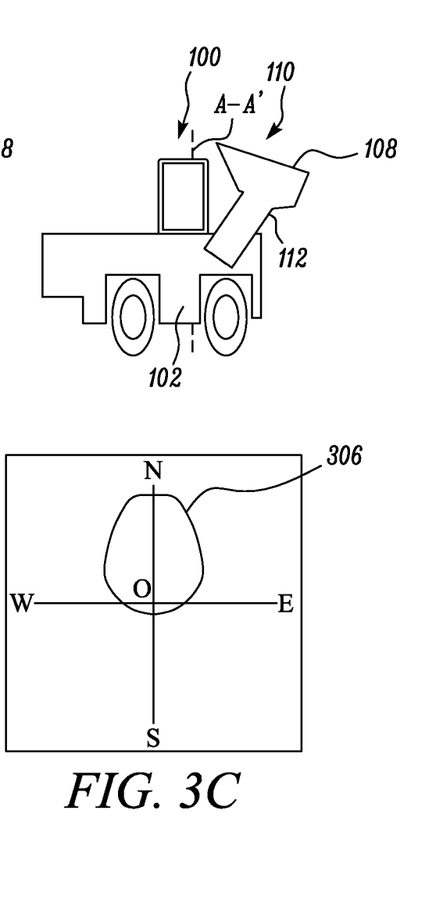

During operation of the machine 100, the machine 100 may be stationary and the implement 108 may move and change positions with respect to the frame 102 while performing different tasks. As a result, a make-up of iron around the magnetometer 206 may change periodically and dynamically which in turn may affect the magnetic field around the magnetometer 206. Referring to FIGS. 3A-3C, schematic representations of changes in the magnetic field detected by the magnetometer 206 due to the position of the implement 108 while the machine 100 is stationary is illustrated. As shown in FIG. 3A, the machine 100 is oriented towards a fixed direction, such as a north direction, and the implement 108 is in a lowered positioned. In this position of the implement 108, the X and Y components of the 2-axis magnetometer 206 may trace out a perfect circle, centered at an origin "O", as the machine 100 rotates about a vertical axis A-A' (shown in FIG. 1). But in reality, some magnetic deviation may be present due to local changes in the magnetic field and may distort the circle to be an approximate ellipse 302. The magnetic deviation may arise due to interference from nearby ferrous objects and/or imperfections in the magnetometer 206 itself.

As the implement 108 may be partially raised when the machine 100 is still oriented towards the north direction, as shown in FIG. 3B, the make-up of the iron around the magnetometer 206 may change. This change in the make-up of the iron along with the magnetic deviation and other imperfections in the magnetometer 206 may alter the ellipse 302 to be an ellipse 304 offset from the origin "O", thus, biasing the ellipse 302 towards the north direction. The offsetting of the ellipse 304 from the origin "O" may result in an incorrect determination of the heading of the machine 100. As the implement 108 may be fully raised when the machine 100 is still oriented towards the north direction, as shown in FIG. 3C, the make-up of the iron around the magnetometer 206 may change further. This change in the make-up of the iron along with the magnetic deviation and other imperfections in the magnetometer 206 may further distort the ellipse 304 and/or further bias the ellipse 304 towards the north direction.

In another aspect, where the magnetometer 206 may be a 3-axis magnetometer 206, the magnetometer 206 may ideally trace out a sphere (not shown) in place of the circle. However, the magnetometer 206 may trace out an ellipsoid (not shown) in place of the ellipse 302, 304, 306 due to the various magnetic deviations as discussed above. It should be noted that the orientation of the machine 100 and the distortion/biasing of the circle/ellipse 302, 304, 306 towards the north direction are merely exemplary and may not limit the scope of the disclosure. In other aspects, the machine 100 may be oriented in any other direction and the circle/ellipse 302, 304, 306 may be distorted/biased in any other way not described herein based on magnetic deviation due to internal and/or external interferences.

Referring to FIG. 2 again, the navigation system 200 includes a controller 208. The controller 208 may embody a single microprocessor or multiple microprocessors configured for receiving signals from the components of the navigation system 200. Numerous commercially available microprocessors may be configured to perform the functions of the controller 208. It should be appreciated that the controller 208 may embody a machine microprocessor capable of controlling numerous machine functions. A person of ordinary skill in the art will appreciate that the controller 208 may additionally include other components and may also perform other functions not described herein.

The controller 208 is communicably coupled to the implement module 202, the inertial sensor 204 and the magnetometer 206. Accordingly, the controller 208 is configured to receive the signal from the implement module 202 indicative of the moving state of the implement 108 and/or the position of the implement 108 in the stationary state with respect to the frame 102 of the machine 100. The controller 208 is also configured to receive the signal from the inertial sensor 204 indicative of the first heading data of the machine 100. The controller 208 is further configured to receive the signal from the magnetometer 206 indicative of the second heading data of the machine 100.

Based on the received signals, the controller 208 is configured to calculate a corrected second heading data. The controller 208 may calculate the corrected second heading data based on a predefined relation between the position of the implement 108 in the stationary state and the second heading data. In one aspect, the predefined relation between the position of the implement 108 in the stationary state and the second heading data may include a lookup table. The lookup table may be stored in a database 210 communicably coupled to the controller 208 or a memory of the controller 208. In other aspects, the predefined relation may include a reference map stored in the database 210 or a memory (not shown) of the controller 208. The lookup table and/or the reference map may include predetermined readings of the corrected second heading data corresponding to the different positions of the implement 108 in the stationary state and the different second heading data. In yet other aspects, the predefined relation may be a predetermined mathematical equation. The mathematical equation may include a multiple polynomial regression model, a physics based model, a neural network model or any other model or algorithm known in the art.

The controller 208 is also configured to determine a correction factor based on the corrected second heading data. The controller 208 may determine the correction factor based on a predefined relation between the second heading data and the corrected second heading data. In one aspect, the predefined relation between the second heading data and the corrected second heading data may include a lookup table stored in the database 210 or the memory of the controller 208. In other aspects, the predefined relation may include a reference map stored in the database 210 or the memory of the controller 208. The lookup table and/or the reference map may include predetermined readings of the correction factor based on the different corrected second heading data and the different second heading data. In yet other aspects, the predefined relation may be a predetermined mathematical equation. The mathematical equation may include the multiple polynomial regression model, the physics based model, the neural network model or any other model or algorithm known in the art.

The controller 208 is further configured to determine the heading of the machine 100. The controller 208 may determine the heading of the machine 100 based on a corrected first heading data. The controller 208 may determine the corrected first heading data based on the correction factor and the first heading data. In other words, the controller 208 may determine the heading of the machine 100 based on the first heading data and the corrected second heading data.

The controller 208 may calculate the corrected first heading data based on a predefined relation between the first heading data and the correction factor. In one aspect, the predefined relation between the first heading data and the correction factor may include a lookup table stored in the database 210 or the memory of the controller 208. In other aspects, the predefined relation may include a reference map stored in the database 210 or the memory of the controller 208. The lookup table and/or the reference map may include predetermined readings of the corrected first heading data corresponding to different first heading data and the different correction factors. In yet other aspects, the predefined relation may be a predetermined mathematical equation. The mathematical equation may include the multiple polynomial regression model, the physics based model, the neural network model or any other model or algorithm known in the art.

In other aspects, the machine 100 may include a positioning system (not shown) communicably coupled to the controller 208. The positioning system may be any positioning system known in the art such as a satellite navigation/positioning system, and so on. The positioning system may be configured to generate a signal indicative of a position data of the machine 100 on ground. In such an aspect, the controller 208 may be configured to determine the heading of the machine 100 based on the position data received from the positioning system, the first heading data and the corrected second heading data. In other words, the controller 208 may be configured to determine the heading of the machine 100 based on the position data received from the positioning system and the corrected first heading data.

The controller 208 may determine the heading of the machine 100 based on a predefined relation between the position data, the first heading data and the corrected second heading data. In one aspect, the predefined relation between the position data, the first heading data and the corrected second heading data may include a lookup table stored in the database 210 or the memory of the controller 208. In other aspects, the predefined relation may include a reference map stored in the database 210 or the memory of the controller 208. The lookup table and/or the reference map may include predetermined readings of the heading of the machine 100 corresponding to the different position data, the different first heading data and the different corrected second heading data. In yet other aspects, the predefined relation may be a predetermined mathematical equation. The mathematical equation may include the multiple polynomial regression model, the physics based model, the neural network model or any other model or algorithm known in the art.

In other aspects, the machine 100 may be in a moving state along with the implement 108 in the moving state as well. The moving state of the machine 100 may refer to angular movement of the machine 100 along the vertical axis A-A' and/or translation of the machine 100 on the ground. The moving state of the implement 108 may refer to the movement of the implement 108 and/or the linkage assembly 110 with respect to the frame 102 of the machine 100. As a result, the implement module 202 may generate the signal indicative of the moving state of the implement 108. Based on the received signal indicative of the moving state of the implement 108, the controller 208 may be configured to determine the heading of the machine 100 based only on the first heading data. In such a situation, the controller 208 may be configured to temporarily ignore the second heading data received from the magnetometer 206 until the implement 108 regains the stationary state. The controller 208 may temporarily ignore the second heading data in order to avoid the dynamic interferences on the magnetometer 206 resulting from the movement of the implement 108 with respect to the frame 102 of the machine 100.

The controller 208 may be configured to provide the heading of the machine 100 based on the corrected first heading data to the operator. Accordingly, the controller 208 is further configured to display the heading of the machine 100 based on the corrected first heading data on the operator interface 212. In some aspects, the heading of the machine 100 may be displayed on the operator interface 212 in the form of numerical, alphabetical, alphanumerical characters and/or symbolic representation. In other aspects, the heading of the machine 100 may be provided to the operator in the form of audible messages. In yet another aspects, the heading of the of the machine 100 may be provided to the operator in the form of visible signals such as glowing of lamps, specifically designated signs/icons on the operator interface 212 or within the operator cabin 116 and so on.

INDUSTRIAL APPLICABILITY

Navigation systems on machines use inertial measurement units along with magnetometers for providing navigation/positioning data of the machine. The magnetometers may have to overcome static and/or dynamic interferences such as iron distortions present around the magnetometer such as platforms, electrical circuits, other ferrous objects present on as well as around the machine and so on. Such interferences on the magnetometer may be compensated by known calibration methods. But, for machines having a moving implement, the make-up of iron around the magnetometer may change dynamically based on the position of the implement with respect to the machine. The known calibration methods for static and/or dynamic interferences may be unable to provide calibration of the magnetometers for dynamic interferences due to the moving implement. As a result, the magnetometer may provide erroneous orientation data leading to incorrect positioning of the machine.

Figure 4:
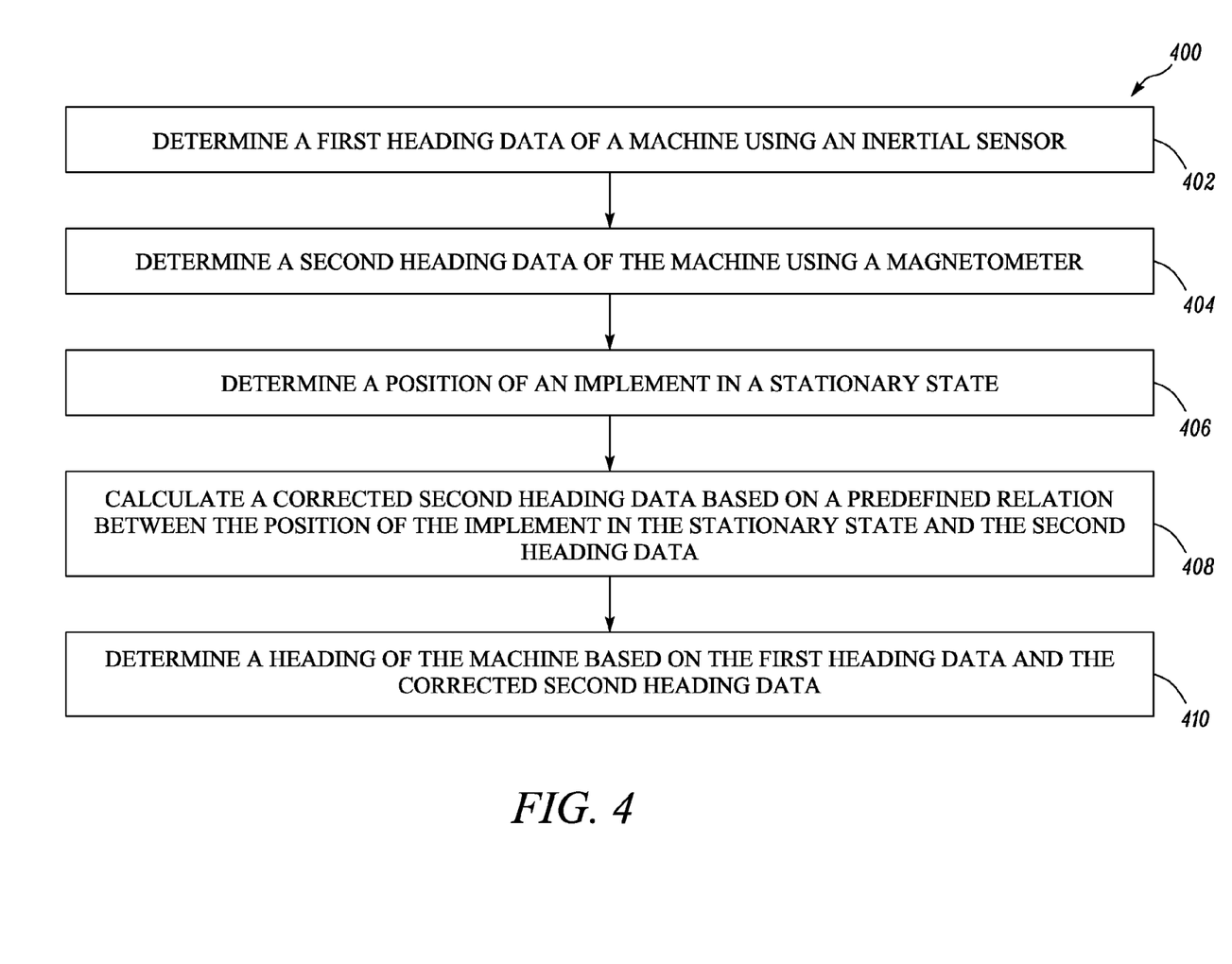
FIG. 4 is a flowchart of a method of determining a heading of the machine, according to an aspect of the present disclosure.

The present disclosure relates to a method 400 of determining the heading of the machine 100 having the implement 108. Referring to FIG. 4, a flowchart of the method 400 is illustrated. At step 402, the controller 208 determines the first heading data of the machine 100 based on the signals received from the inertial sensor 204. The inertial sensor 204 may be any sensor known in the art such as the accelerometer, the gyroscopic sensor, the angular rate sensor, the yaw rate sensor and so on.

At step 404, the controller 208 determines the second heading data of the machine 100 based on the signals received from the magnetometer 206. At step 406, the controller 208 determines the position of the implement 108 in the stationary state with respect to the frame 102 based on the signals received from the implement module 202.

At step 408, the controller 208 determines the corrected second heading data based on the predefined relation between the position of the implement 108 in the stationary state and the second heading data. The predefined relation may include the lookup table, the reference map and/or the mathematical equation. The controller 208 is also configured to determine the correction factor based on the predefined relation between the corrected second heading data and the second heading data. The predefined relation may include the lookup table, the reference map and/or the mathematical equation.

At step 410, the controller 208 determines the heading of the machine 100. The controller 208 determines the heading of the machine 100 based on the corrected first heading data. The controller 208 determines the corrected first heading data based on the correction factor and the first heading data. In other words, the controller 208 determines the heading of the machine 100 based on the first heading data and the corrected second heading data. The controller 208 determines the corrected first heading data based on the predefined relation between the first heading data and the correction factor. The predefined relation may include the lookup table, the reference map and/or the mathematical equation.

In the aspect when the machine 100 may include the positioning system, the controller 208 determines the heading of the machine 100 based on the position data received from the positioning system, the first heading data and the corrected second heading data. In other words, the controller 208 determines the heading of the machine 100 based on the position data received from the positioning system and the corrected first heading data. The controller 208 determines the heading of the machine 100 based on the predefined relation between the position data, the first heading data and the corrected second heading data. The predefined relation may include the lookup table, the reference map and/or the mathematical equation.

In the aspect when the machine 100 may be in the moving state on the ground along with the implement 108 in the moving state as well, the controller 208 detects the movement of the implement 108 based on the signal received from the implement module 202. Based on the received signal indicative of the moving state of the implement 108, the controller 208 determines the heading of the machine 100 based only on the first heading data. In such a situation, the controller 208 may temporarily ignore the second heading data received from the magnetometer 206 until the implement 108 may regain the stationary state.

The navigation system 200 provides improved calibration for the magnetometer 206 against the dynamic interferences such as the movement of the implement 108. This in turn provides improved positioning of the machine 100 by the navigation system 200. Additionally, in the aspect when the machine 100 may include the positioning system, the navigation system 200 may provide using only one positioning receiver in place of multiple positioning receivers. In some circumstances, when the positioning system may degrade or stop functioning, the navigation system 200 may continue to provide accurate positioning of the machine 100. Further, temporarily ignoring the second heading data provides for improvement in the positioning of the machine 100 when the machine 100 may be in the moving state along with the implement 108 in the moving state. In other aspects, the navigation system 200 with or without modifications may also be used in the field of robotics. The correction and calibration method provided by the navigation system 200 may be used for accurately positioning a moving robotic arm such as in production/assembly systems.

While aspects of the present disclosure have been particularly shown and described with reference to the aspects above, it will be understood by those skilled in the art that various additional aspects may be contemplated by the modification of the disclosed machines, systems and methods without departing from the spirit and scope of what is disclosed. Such aspects should be understood to fall within the scope of the present disclosure as determined based upon the claims and any equivalents thereof.

What is claimed is:

1. A method of determining a heading of a machine having a frame and a work implement to perform work on a worksite, the work implement attached to the frame through a linkage, and moveable in respect to the frame through the linkage, the method comprising:
   determining with an implement module that the work implement is in one of a moving state and a stationary state;
   determining a position of the work implement in relation to the frame with the implement module;
   determining a first heading data of the machine using an inertial sensor;
   determining a second heading data of the machine using a magnetometer;
   calculating a corrected second heading data based on a predefined relation between the position of the work implement in relation to the frame and the second heading data, when the work implement is in a stationary state; and
   determining the heading of the machine based on the first heading data and the corrected second heading data, when the work implement is in the stationary state.

2. The method of claim 1, wherein the predefined relation between the position of the work implement when the work implement is in the stationary state and the second heading data comprises a lookup table.

3. The method of claim 1 further comprising
   determining the heading of the machine based on the first heading data when the work implement is in the moving state.

4. The method of claim 1, wherein the inertial sensor is a gyroscopic sensor.

5. The method of claim 1 further comprising:
   receiving a position data from a global positioning system associated with the machine; and
   determining the heading of the machine based on the first heading data, the corrected second heading data and the position data of the machine, when the work implement is in the stationary state.

6. The method of claim 1, wherein the machine is a hydraulic excavator, and the linkage includes an arm and a pivot.

7. The method of claim 1, wherein the work implement is a bucket.

8. A navigation system of a machine, the machine including a frame and a work implement for performing work on a worksite, the work implement attached to the frame through a linkage, and moveable in respect to the frame through the linkage, the navigation system comprising:
   an inertial sensor configured to provide a first heading data of the machine;
   a magnetometer configured to provide a second heading data of the machine; and
   an implement module configured to determine the work implement is in one of a stationary state and a moving state, and to determine a position of the implement when the work implement is in a stationary state; and
   wherein the navigation system is configured to:
      calculate a corrected second heading data based on a predefined relation between the position of the work implement and the second heading data when the work implement is in the stationary state; and
      determine a heading of the machine based on the first heading data and the corrected second heading data when the work implement is in the stationary state.

9. The navigation system of claim 8, wherein the predefined relation between the position of the work implement in the stationary state and the second heading data comprises a lookup table.

10. The navigation system of claim 8 being further configured to
    determine the heading of the machine based on the first heading data when the work implement is in the moving state.

11. The navigation system of claim 8, wherein the inertial sensor is a gyroscopic sensor.

12. The navigation system of claim 8 being further configured to:
    receive a position data from a global positioning system associated with the machine; and
    determine the heading of the machine based on the first heading data, the corrected second heading data and the position data of the machine.

13. The system of claim 8, wherein the machine is a wheel loader.

14. The system of claim 8, wherein the linkage moves the work implement in respect to the frame with at least one hydraulic cylinder, and the implement module determines that the work implement is in one of a stationary state and a moving state, at least in part, in response to a pressure signal from a pressure sensor for measuring pressure in the at least one hydraulic cylinder.

15. A machine comprising:
    a frame;
    a work implement for performing work at a worksite, the work implement attached to the frame through a linkage, and movable with respect to the frame through the linkage; and
    a navigation system associated with the machine, the navigation system comprising:
       an inertial sensor configured to detect a first heading data of the machine;
       a magnetometer configured to detect a second heading data of the machine; and
       an implement module operatively coupled to the work implement and configured to determine that the work implement is in one of a stationary state and a moving state, and a position of the work implement when the work implement is in the stationary state; and
    wherein the navigation system is configured to:
       calculate a corrected second heading data based on a predefined relation between the position of the work implement and the second heading data, when the work implement is in the stationary state; and
       determine a heading of the machine based on the first heading data and the corrected second heading data when the work implement is in the stationary state.

16. The machine of claim 15, wherein the predefined relation between the position of the work implement and the second heading data when the work implement is in the stationary state comprises a lookup table.

17. The machine of claim 15, wherein the navigation system is further configured to
    determine the heading of the machine based on the first heading data when the work implement is in the moving state.

18. The machine of claim 15, wherein the inertial sensor is a gyroscopic sensor.

19. The machine of claim 15, wherein the machine is a hydraulic excavator.

20. The machine of claim 15, wherein the work implement is a bucket.

* * * * *